(12) United States Patent
Hong et al.

(10) Patent No.: US 11,322,068 B2
(45) Date of Patent: May 3, 2022

(54) DISPLAY DEVICE HAVING GATE DRIVER

(71) Applicant: LG Display Co., Ltd., Seoul (KR)

(72) Inventors: Yewon Hong, Paju-si (KR); TaeWoong Moon, Paju-si (KR); JunHyeon Bae, Paju-si (KR); Yeonkyung Kim, Paju-si (KR); Yeonwoo Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/465,723

(22) Filed: Sep. 2, 2021

(65) Prior Publication Data

US 2022/0093027 A1 Mar. 24, 2022

(30) Foreign Application Priority Data

Sep. 18, 2020 (KR) .................. 10-2020-0120394

(51) Int. Cl.
*G09G 3/20* (2006.01)

(52) U.S. Cl.
CPC ............ *G09G 3/20* (2013.01); *G09G 2310/08* (2013.01); *G09G 2320/0214* (2013.01); *G09G 2330/028* (2013.01)

(58) Field of Classification Search
CPC .............. G09G 3/20; G09G 2310/08; G09G 2320/0214; G09G 2330/028; G09G 3/3266; G09G 3/3674; G09G 2310/0267
See application file for complete search history.

(56) References Cited

U.S. PATENT DOCUMENTS

| | | | |
|---|---|---|---|
| 2011/0175674 A1* | 7/2011 | Shimizu | H01L 29/66969 257/E29.296 |
| 2015/0029082 A1* | 1/2015 | Jeon | G09G 3/3677 377/64 |
| 2016/0225307 A1* | 8/2016 | Yoon | G09G 3/3696 |
| 2017/0069283 A1* | 3/2017 | You | G09G 3/2092 |
| 2018/0130435 A1* | 5/2018 | Lee | G09G 3/3677 |
| 2019/0206502 A1* | 7/2019 | Lim | G09G 3/20 |

* cited by examiner

*Primary Examiner* — Christopher J Kohlman
(74) *Attorney, Agent, or Firm* — Seed IP Law Group LLP

(57) ABSTRACT

A display device having a gate driver, which may reduce a leakage current of a TFT and power consumption, is disclosed. Each stage of the gate driver comprises an output portion including a pull-up transistor outputting a corresponding clock of a plurality of clocks as a gate signal in response to control of a Q node, and a pull-down transistor outputting a gate-off voltage as an off-voltage of a gate signal in response to control of a QB node; a controller charging and discharging the Q node and charging and discharging the QB node to be in an opposite state of the Q node; and a back bias circuit having a back bias node capacitance-coupled with the Q node and generating a back gate bias voltage to apply the back gate bias voltage to the back bias node for an off-period of the Q node, wherein the back bias circuit may apply the back gate bias voltage to light shielding layers of some transistors, which are turned off for the off-period of the Q node, among transistors constituting the output portion and the controller, through the back bias node, thereby reducing or minimizing a leakage current of the corresponding transistors.

20 Claims, 10 Drawing Sheets

DISPLAY DEVICE HAVING GATE DRIVER

CROSS-REFERENCE TO RELATED APPLICATIONS

This application claims the benefit of the Korean Patent Application No. 10-2020-0120394 filed on Sep. 18, 2020, which are hereby incorporated by reference as if fully set forth herein.

BACKGROUND

Technical Field

The present disclosure relates to a display device having a gate driver, which may reduce a leakage current of a thin film transistor and power consumption.

Description of the Related Art

A display device includes a panel for displaying an image through a pixel matrix, and a driving circuit for driving the panel. Each of pixels constituting the pixel matrix is independently driven by a thin film transistor (TFT). A gate driver among the various driving circuits within the display device drives a gate line connected with the TFT of each pixel, and a data driver among the driving circuit drives a data line connected with the TFT.

The gate driver includes stages which respectively drive gate lines, and each stage is comprised of a plurality of TFTs. A gate-in-panel (GIP) type gate driver formed in a panel together with a TFT array of a pixel matrix is known as the gate driver.

BRIEF SUMMARY

When an N-type oxide TFT applied to the gate driver has a negative threshold voltage Vth, a low voltage applied to a gate for turn-off is not lower than a source voltage, whereby a leakage current is increased. The inventors of the present disclosure have recognized that when the leakage current is increased in the TFTs constituting the gate driver, output waveforms of the gate driver may be distorted, whereby problems may occur in that reliability is deteriorated and power consumption is increased. In this respect, the inventors have appreciated that a method for reducing or minimizing the leakage current would be beneficial.

One or more embodiments of the present disclosure provides a display device having a gate driver, which may reduce a leakage current of a TFT and power consumption.

In addition to the technical benefits of the present disclosure as mentioned above, additional technical benefits and features of the present disclosure will be clearly understood by those skilled in the art from the following description of the present disclosure.

In a display device according to an aspect of the present disclosure, a gate driver may comprise a plurality of stages, each stage including an output portion, a controller, and a back bias circuit. The output portion may include a pull-up transistor outputting a corresponding clock among a plurality of clocks as a gate signal in response to control of a Q node, and a pull-down transistor outputting a gate-off voltage as an off-voltage of a gate signal in response to control of a QB node. The controller may charge and discharge the Q node and charge and discharge the QB node to be in an opposite state as the Q node. The nodes may have logic states such as a high state (a logic '1') or a low state (a logic '0'). For example, when the Q node and the QB node are referred to as being in an opposite state, this means that when the Q node is in a logic high state, the QB node is in a logic low state and when the Q node is in a logic low state, the QB node is in a logic high state. The back bias circuit may have a back bias node capacitance-coupled with the Q node and generate a back gate bias voltage to apply the back gate bias voltage to the back bias node for an off-period of the Q node. The back bias circuit may apply the back gate bias voltage to light shielding layers of some transistors, which are turned off for the off-period of the Q node, among transistors constituting the output portion and the controller, through the back bias node.

In a display device according to an aspect of the present disclosure, a gate driver may comprises a plurality of stages, each stage including an output portion, a charging portion, a discharging portion and a back bias circuit. The output portion may include a pull-up transistor pulled-up by control of a Q node, outputting a first input clock of a plurality of clocks to an output terminal, and a pull-down transistor pulled-down by control of a second input clock, outputting a gate-off voltage to the output terminal. The charging portion may include a charging transistor precharging the Q node with a set signal, which is any one of a start signal and an output of a preceding stage, in response to the set signal. The discharging portion may include a first discharging transistor discharging the Q node in response to control of a third input clock, and a second discharging transistor discharging the Q node in response to a reset signal or an output of a subsequent stage. The back bias circuit may have a back bias node capacitance-coupled with the Q node and generate a back gate bias voltage in the back bias node for an off-period of the Q node by the discharging portion. The back bias circuit may apply a back gate bias voltage, which is lower than the gate-off voltage, to a light shielding layer of the pull-up transistor, which is turned off for the off-period of the Q node, through the back bias node.

In addition to the features of the present disclosure as mentioned above, additional technical benefits and features of the present disclosure will be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are explanatory and are intended to provide further explanation of the inventive concepts as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principles of the disclosure. In the drawings.

DETAILED DESCRIPTION

Figure 1:
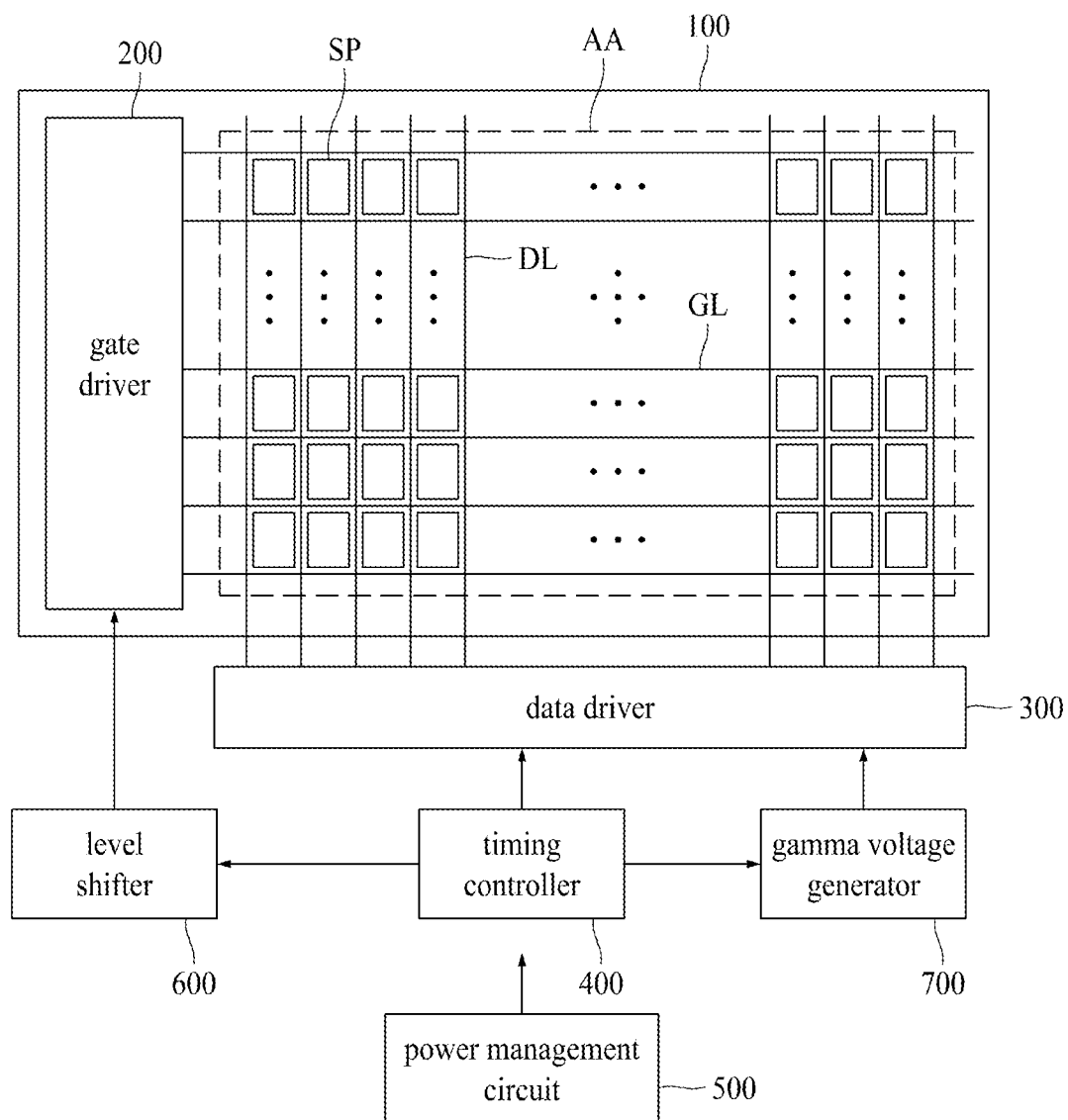
FIG. 1 is a block view illustrating a structure of a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case which is not continuous may be included unless a more limiting term, such as "just," "immediate(ly)," or "direct(ly)" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, the terms "first," "second," "A," "B," "(a)," "(b)," etc., may be used. These terms are intended to identify the corresponding elements from the other elements, and basis, order, or number of the corresponding elements should not be limited by these terms. The expression that an element or a layer is "connected," "coupled," or "adhered" to another element or layer, the element or layer can not only be directly connected or adhered to another element or layer, but also be indirectly connected or adhered to another element or layer with one or more intervening elements or layers "disposed" between the elements or layers, unless otherwise specified.

The term "at least one" should be understood as including any and all combinations of one or more among the associated listed elements. For example, the meaning of "at least one or more of a first element, a second element, and a third element" denotes the combination of all elements proposed from two or more of the first element, the second element, and the third element as well as the first element, the second element, or the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the embodiment of the present disclosure will be described with reference to the accompanying drawings. Since a scale of each of elements shown in the accompanying drawings is different from an actual scale for convenience of description, the present disclosure is not limited to the shown scale.

Figure 2:
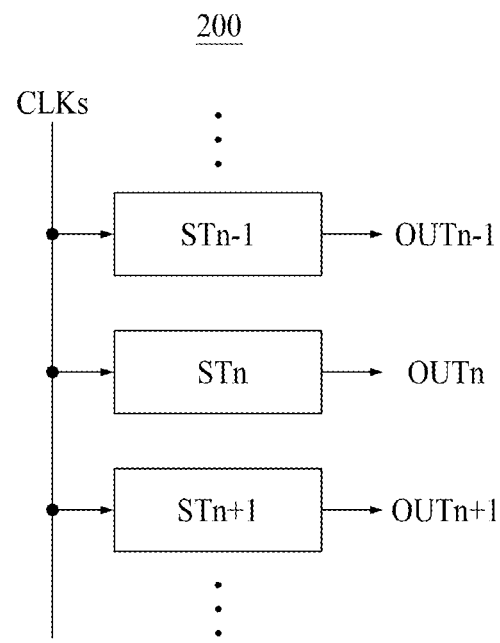
FIG. 2 is a schematic block view illustrating some stages of a gate driver according to one embodiment of the present disclosure.

FIG. 1 is a block view illustrating a structure of a display device according to one embodiment of the present disclosure, and FIG. 2 is a schematic block view illustrating some stages of a gate driver according to one embodiment of the present disclosure.

A display device according to one embodiment of the present disclosure may be any one of various display devices such as a liquid crystal display device, an electroluminescent display device, and a micro light emitting diode (micro-LED) display device. The electroluminescent display device may be an Organic Light Emitting Diode (OLED) display device, a Quantum-dot Light Emitting Diode display device, or an Inorganic Light Emitting Diode display device.

Referring to FIG. 1, the display device may include a display panel (hereafter, panel) 100, a GIP type gate driver 200, a data driver 300, a timing controller 400, a level shifter 600, a gamma voltage generator 700, and a power management circuit 500.

The power management circuit 500 may generate and output various driving voltages for operations of all elements of the display device, that is, operations of the panel 100, the gate driver 200, the data driver 300, the timing controller 400, the level shifter 600, and the gamma voltage generator 700, by using an input voltage which is externally supplied.

The timing controller 400 may receive image data and synchronization signals from an external host system. The host system may be any one of a computer, a TV system, a set-top box, and a portable terminal system, such as a tablet or a cellular phone. The synchronization signals may include a dot clock, a data enable signal, a vertical synchronization signal, and a horizontal synchronization signal.

The timing controller 400 may perform a variety of image processing, such as luminance correction for reduction of power consumption or picture quality correction, with respect to the image data and supply the image-processed data to the data driver 300.

The timing controller 400 may generate a plurality of data control signals by using the synchronization signals and timing configuration information (e.g., start timing and pulse width) stored therein and supply the generated data control signals to the data driver 300. The timing controller 400 may generate a plurality of control signals and supply the generated control signals to the level shifter 600.

The gamma voltage generator 700 may generate a reference gamma voltage set including a plurality of reference gamma voltages having voltage levels different from one another and supply the reference gamma voltage set to the data driver 300. The gamma voltage generator 700 may generate a plurality of reference gamma voltages corresponding to gamma characteristics of the display device under the control of the timing controller 400 and supply the reference gamma voltages to the data driver 300. The gamma voltage generator 700 may be comprised of a programmable gamma IC. The gamma voltage generator 700 may receive gamma data from the timing controller 400, generate or adjust a reference gamma voltage level in accordance with the gamma data and output the reference gamma voltage level to the data driver 300.

The data driver 300 is controlled in accordance with the data control signal supplied from the timing controller 400, converts digital data supplied from the timing controller 400 to analog data signals and supplies the corresponding data signal to each of data lines of the panel 100. The data driver 300 may convert the digital data into the analog data signals by using gradation voltages segmented from the plurality of reference gamma voltages supplied from the gamma voltage generator 700.

The level shifter 600 may generate a plurality of gate control signals based on the plurality of control signals supplied from the timing controller 400 and supply the generated gate control signals to the gate driver 200. The level shifter 600 may level-shift a start signal and a reset signal supplied from the timing controller 400 and supply the level-shifted start signal and reset signal to the gate driver 200. The level shifter 600 may generate a plurality of GIP clocks of different phases by logically processing on-clock and off-clock which are supplied from the timing controller 400 and supply the GIP clocks to the gate driver 200. The on-clock may determine a rising timing of each of the GIP clocks, and the off-clock may determine a falling timing of each of the GIP clocks.

The panel 100 displays an image or/and a video through a display area AA on which subpixels SP are arranged in a matrix form. Each subpixel SP is any one of a red (R) subpixel for emitting red light, a green (G) subpixel for emitting green light, a blue (B) subpixel for emitting blue light, and a white (W) subpixel for emitting white light, and is independently driven by at least one TFT. A unit pixel may be configured by combination of two subpixels, three subpixels or four subpixels, which have their respective colors different from one another.

The panel 100 may further include a touch sensor screen for sensing a user's touch by fully overlapping the display area AA. The touch sensor screen may be embedded in the panel 100 or disposed on the display area AA of the panel 100.

The gate driver 200 is comprised of TFTs formed by the same process as that of a TFT array disposed on the display area AA of the panel 100, and may be disposed on a bezel area of either both sides or one side of the panel 100 in a Gate-In-Panel (GIP) type.

The gate driver 200 may be supplied with the plurality of gate control signals from the level shifter 600 to individually drive the gate lines GL of the panel 100 by a shifting operation. The gate driver 200 is comprised of a shift register having a plurality of stages dependently connected with one another to drive each of the plurality of gate lines GL, generating an individual gate output.

For convenience, FIG. 2 illustrates three stages STn−1, STn and STn+1 (n is a natural number), which respectively generate three gate outputs OUTn−1, OUTn and OUTn+1 of a plurality of stages constituting the gate driver 200.

Each stage STn may be supplied with at least any one of a plurality of clock signals CLKs having their respective phases different from each other. Each stage STn may output a clock signal correspond to an input clock signal input as a scan signal to the gate output OUTn in response to any one (set signal) of a start signal and an output of a preceding stage. Each stage STn may output a gate-off voltage to the gate output OUTn in response to any one of the reset signal and an output of a subsequent stage. The gate output OUTn or carry output of each stage STn may be used as a carry signal and supplied to another stage as a set signal or a reset signal. The preceding stage means any one of stages located prior to (above) the corresponding stage, and the subsequent stage means any one of stages located after (below) the corresponding stage.

At least one of an amorphous silicon TFT using an amorphous silicon semiconductor layer, a poly silicon TFT using a polysilicon semiconductor layer, or an oxide TFT using a metal oxide semiconductor layer may be applied to the TFT disposed in the bezel area including the gate driver 200 and the display area AA of the panel 100.

For example, an oxide TFT, which has mobility higher than that of the amorphous silicon TFT, and enables a lower temperature process and is easier to be applied to a large area than the polysilicon silicon TFT, may be applied to the panel 100, and a coplanar type oxide TFT having good TFT characteristics may be applied to the panel 100.

Figure 3:
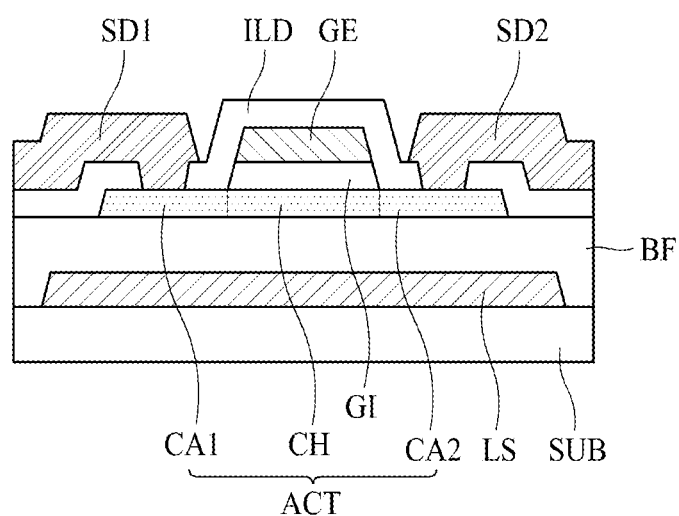
FIG. 3 is a cross-sectional view illustrating a coplanar oxide TFT structure according to one embodiment of the present disclosure.

FIG. 3 is a cross-sectional view illustrating a coplanar type oxide TFT structure according to one embodiment of the present disclosure.

Referring to FIG. 3, the coplanar type oxide TFT includes a light shielding layer LS on a substrate SUB, a buffer film BF covering the light shielding layer LS, a semiconductor layer ACT on the buffer film BF, a gate insulating film GI and a gate electrode GE deposited on the semiconductor layer ACT, an inter-layer dielectric film ILD covering the semiconductor layer ACT and the gate insulating film GI and the gate electrode GE, and first and second source/drain electrodes SD1 and SD2 respectively connected with first and second conductorization areas CA1 and CA2 of the semiconductor layer ACT through a contact hole of the inter-layer dielectric film ILD. Any one of the first and second source/drain electrodes SD1 and SD2 is a source electrode, and the other one is a drain electrode.

The semiconductor layer ACT includes a channel area CH overlapped with the gate electrode GE by interposing the gate insulating film GI, and first and second conductorization areas CA1 and CA2 disposed at both sides of the channel area CH and conductorized to be in ohmic contact with the first and second source/drain electrodes SD1 and SD2, respectively. The semiconductor layer ACT includes an oxide semiconductor material. For example, the semiconductor layer ACT may include at least one of IZO (InZnO)-based, IGO(InGaO)-based, ITO(InSnO)-based, IGZO(InGaZnO)-based, IGZTO(InGaZnSnO)-based, GZTO(GaZnSnO)-based, GZO(GaZnO)-based or ITZO(InSnZnO)-based oxide semiconductor material.

The light shielding layer LS is made of an opaque metal, and absorbs external light or internal light to prevent light from entering the oxide semiconductor layer ACT. The light shielding layer LS may be floated, or may be connected with any one of the first and second source/drain electrodes SD1 and SD2.

The light shielding layer LS may be used as a bottom gate electrode and the gate electrode GE may be used as a top gate electrode, whereby the coplanar oxide TFT shown in FIG. 3 may operate as a double gate TFT.

The coplanar oxide TFT has a great on-current (Ion) due to a thin thickness of the gate insulating film GI, has a sharp slope of gate voltage to current characteristics and thus has a small S-factor which is an inverse number of the slope, and has small parasitic capacitance, as compared with a back channel etched type oxide TFT. Therefore, when the coplanar oxide TFT is applied to the gate driver 200, it has advantages in that it enables high speed driving and may reduce a TFT size. The S-factor is a current-voltage characteristic of a TFT, and means a size of gate voltage for increasing a drain current as much as ten times when a gate voltage of a threshold voltage or less is applied.

The gate driver 200 according to one embodiment may use an N type coplanar oxide TFT, and when the corresponding TFT is turned off, it is general that an off voltage applied to the gate electrode GE is the same as a voltage applied to the source electrode SD1. At this time, when the corresponding TFT has a negative threshold voltage (Vth<0), a difference between a gate-source voltage Vgs and a threshold voltage Vth becomes greater than 0V (Vgs−Vth>0V), whereby a leakage current may be increased. In order to avoid this, the gate driver 200 further applies a back gate bias voltage lower than the source electrode SD1 to the light shielding layer LS which is a back gate electrode while the corresponding TFT is being turned off, whereby a negative threshold voltage may be shifted to a positive threshold voltage. As a result, the leakage current may be reduced or minimized, and power consumption may be reduced.

For example, the gate driver 200 further applies a back gate bias voltage lower than the source voltage to the light shielding layer LS of corresponding TFTs which account for a large proportion of a leakage current for a period when a corresponding gate output is off, among a plurality of TFTs belonging to each stage connected with each gate line GL, whereby a leakage current may be reduced or minimized, and a back bias circuit for reducing or minimizing the leakage current may be provided for each stage. Regarding this, a detailed description will be given later.

Figure 4:
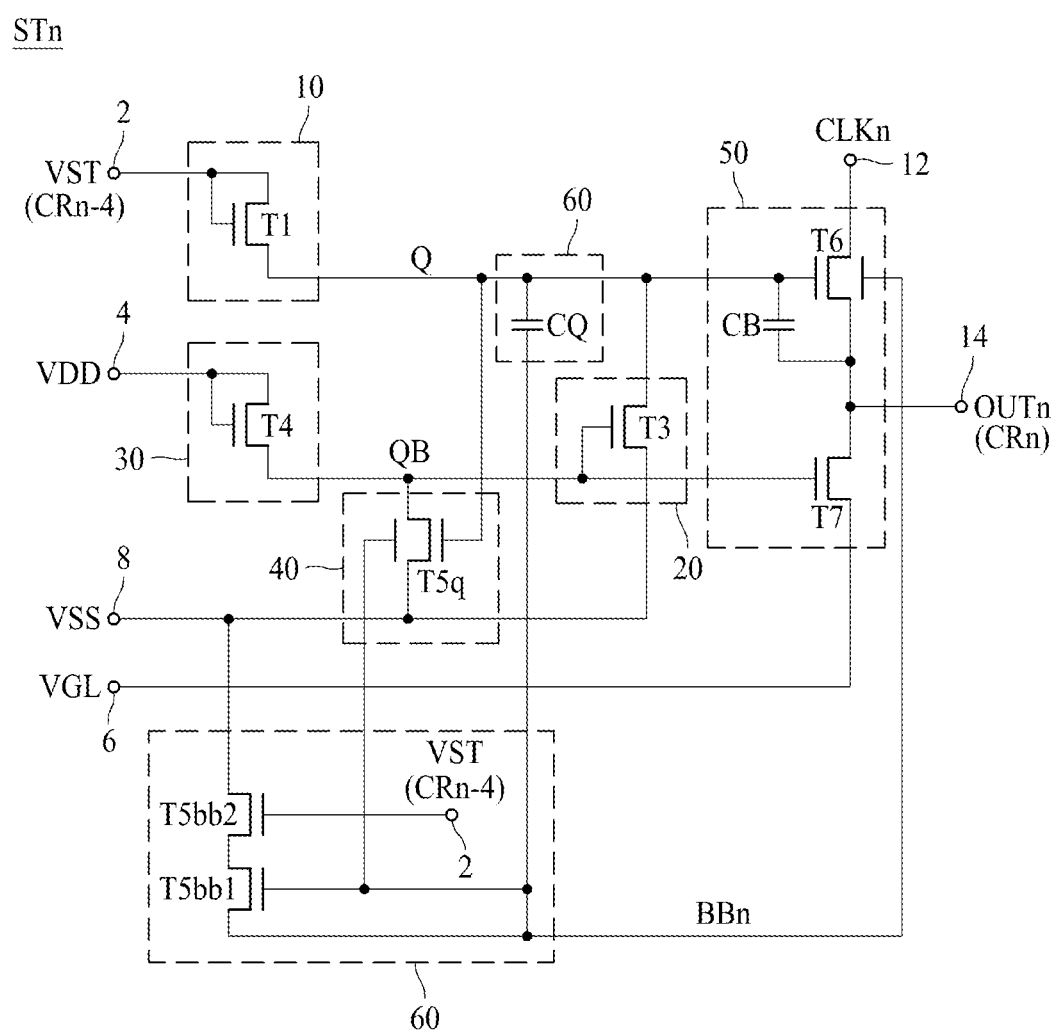
FIG. 4 is an equivalent circuit view illustrating a structure of each stage according to one embodiment of the present disclosure.
Figure 5:
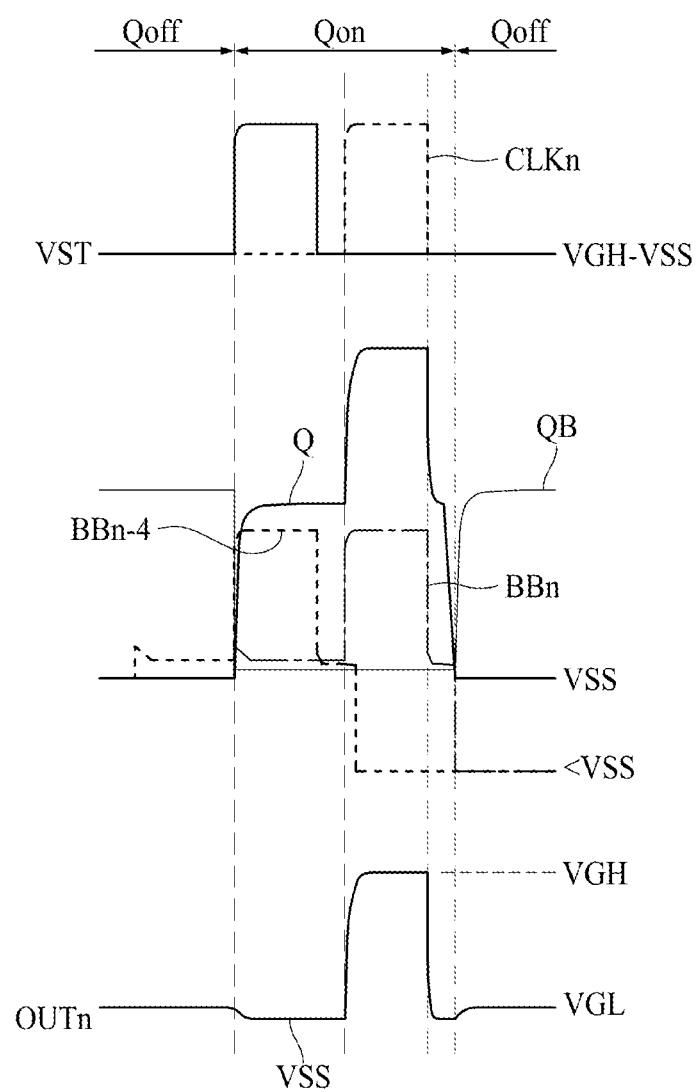
FIG. 5 is a driving waveform view of a stage shown in FIG. 4.

FIG. 4 is an equivalent circuit view illustrating a structure of each stage STn in a gate driver according to one embodiment of the present disclosure, and FIG. 5 is a driving waveform view of the stage STn shown in FIG. 4.

Referring to FIG. 4, each stage STn may include a first charging portion 10, a first discharging portion 20, a second charging portion 30, a second discharging portion 40, an output portion 50, and a back bias circuit 60. The first charging portion 10, the first discharging portion 20, the second charging portion 30, and the second discharging portion 40 may be defined as controllers.

Each of transistors T1, T3, T4, T5q, T6, T7, T5bb1 and T5bb2 constituting each stage STn, as shown in FIG. 3, may be a coplanar type oxide TFT that includes a light shielding layer LS.

Each stage STn may include a set terminal 2 to which any one of a start signal VST and an output CRn−4 of a preceding stage is applied as a set signal, a first power terminal 4 to which a high potential voltage VDD is applied, a second power terminal 6 to which a first gate-off voltage VGL is applied, a third power terminal 8 to which a second gate-off voltage VSS is applied, a clock terminal 12 to which a clock signal CLKn is applied, and an output terminal 14 to which a gate output OUTn is applied. For example, the first and second gate-off voltages VGL and VSS may be first and second gate low voltages. The second gate-off voltage VSS may be a voltage lower than the first gate-off voltage VGL. The gate output OUTn of each stage STn may be output to another stage as a carry signal CRn.

The first charging portion 10 may be supplied with the start signal VST or the output CRn−4 of the preceding stage as a set signal through the set terminal 2, and may charge a Q node with the set signal. The output CRn−4 of the preceding stage may be a gate output OUTn−4 output from an (n−4)th preceding stage. The first charging portion 10 may include a diode type Q charging transistor T1 in which a gate electrode and a drain electrode are connected to the set terminal 2 and a source electrode is connected to the Q node. The Q charging transistor T1 may be turned on when the start signal VST or the output CRn−4 of the preceding stage shown in FIG. 5 is high logic, thereby precharging the Q node with high logic.

The first discharging portion 20 may discharge the Q node with the second gate-off voltage VSS of the third power terminal 8 in response to control of a QB node. The first discharging portion 20 may include a Q discharging transistor T3 in which a gate electrode is connected to the QB node, a source electrode is connected to the third power terminal 8 and a drain electrode is connected to the Q node. The Q discharging transistor T3 may be turned on when the QB node is high logic, thereby discharging the Q node with the second gate-off voltage VSS. The Q discharging transistor T3 may prevent ripple of the Q node from occurring due to transition of the clock signal CLKn and prevent an output defect from occurring due to the ripple by discharging the Q node for an off-period Qoff of the Q node shown in FIG. 5.

The second charging portion 30 may charge the QB node with the high potential voltage VDD in response to the high potential voltage VDD applied to the first power terminal 4. The second charging portion 30 may include a diode type QB charging transistor T4 in which a gate electrode and a drain electrode are connected to the first power terminal 4 and a source electrode is connected to the QB node. The QB charging transistor T4 may be turned on by the high potential voltage VDD applied for an active period of each frame to charge the QB node with the high potential voltage VDD.

The second discharging portion 40 may discharge the QB node with the second gate-off voltage VSS of the third power terminal 8 in response to the control of the Q node. The second discharging portion 40 may include a QB discharging transistor T5*q* in which a gate electrode is connected to the Q node, a source electrode is connected to the third power terminal 8 and a drain electrode is connected to the QB node. The QB discharging transistor T5*q* may be turned on when the Q node is high logic, thereby discharging the QB node with the second gate-off voltage VSS. Therefore, the even though the QB charging transistor T4 is maintained at a turn-on state by the high potential voltage VDD for the active period of each frame, as shown in FIG. 5, the QB node may be discharged through the QB discharging transistor T5*q* for an on-period Qon of the Q node, whereby the QB node may be operated at a logic state opposite to that of the Q node.

The output portion 50 includes a pull-up transistor T6 pulled-up by the control of the Q node to output the clock signal CLKn applied to the clock terminal 12 to the gate output OUTn through the output terminal 14, and a pull-down transistor T7 pulled-down by the control of the QB node opposite to the Q node to output the first gate-off voltage VGL from the second power terminal 6 to the gate output OUTn through the output terminal 14. The Q node may be defined as a first control node, and the QB node may be defined as a second control node.

In the pull-up transistor T6, a gate electrode may be connected to the Q node, a source electrode may be connected to the output terminal 14, and a drain electrode may be connected to the clock terminal 12. The pull-up transistor T6 may be turned on for the on-period Qon of the Q node shown in FIG. 5 to output the clock signal CLKn input from the clock terminal 12 as a scan signal to the gate output OUTn through the output terminal 14. The pull-up transistor T6 may output the gate output OUTn having the gate-on voltage VGH and the gate-off voltage VSS of the clock signal CLKn for the on-period Qon of the Q node.

The output portion 50 further includes a first capacitor CB connected between the gate electrode (Q node) and the source electrode (output terminal 14) of the pull-up TFT T6. The first capacitor CB may reduce a rising time of the gate output OUTn by amplifying high logic of the Q node through bootstrapping as shown in FIG. 5 when the pull-up transistor T6 is pulled-up to output the gate-on voltage VGH of the clock signal CLKn.

In the pull-down transistor T7, a gate electrode may be connected to the QB node, a source electrode may be connected to the second power terminal 6, and a drain electrode may be connected to the output terminal 14. The pull-down transistor T7 may be turned on for the on-period of the QB node, which corresponds to an off-period Qoff of the Q node shown in FIG. 5, to output the first gate-off voltage VGL input from the second power terminal 6 as an off voltage to the gate output OUTn through the output terminal 14.

The back bias circuit 60 may be provided with a back bias node BBn coupled with the Q node, and may generate a back gate bias voltage lower than the second gate-off voltage VSS for the off-period Qoff of the Q node. The back bias circuit 60 may apply a back gate bias voltage lower than the corresponding source voltage to the light shielding layers LS of the transistors T6 and T5*q*, which account for a large proportion of a leakage current, through the back bias node BBn, thereby reducing or minimizing the leakage current of the corresponding transistors T6 and T5*q*.

The back bias circuit 60 may include a second capacitor CQ connected between the Q node and the back bias node BBn, a first transistor T5*bb* 1 connected to the back bias node BBn in a diode type, and a second transistor T5*bb*2 resetting the back bias node BBn through the first transistor T5*bb* 1. The back bias node BBn may be connected with transistors which account for a large proportion of a leakage current, for example, the light shielding layers LS of the pull-up transistor T6 and the QB discharging transistor T5*q* for the off-period Qoff of the Q node.

The first transistor T5*bb*1 is a diode type transistor in which a gate electrode and a drain electrode are connected to the back bias node BBn and a source electrode is connected to a drain electrode of the second transistor T5*bb*2. In the second transistor T5*bb*2, a gate electrode is connected to the set terminal 2, a source electrode is connected to the third power terminal 8, and a drain electrode is connected to the source electrode of the first transistor T5*bb*1.

The second transistor T5*bb*2 resets the back bias node BBn to a second gate-off voltage VSS through the first transistor T5*bb*1 in response to the start signal VST or the output CRn–4 of the preceding stage supplied through the set terminal 2, and then is turned off. While the second transistor T5*bb*2 is being turned off, the back bias node BBn may be floated and may generate a back gate bias voltage varied depending on a voltage of the Q node by coupling of the second capacitor CQ.

Referring to FIG. 5, while the Q node is being precharged with high logic during the on-period Qon of the Q node, the back bias node BBn is reset to the second gate-off voltage VSS through the second transistor T5*bb*2 and the first transistor T5*bb* 1.

Then, while the Q node is being bootstrapped during the on-period Qon of the Q node, that is, while the pull-up transistor T6 is outputting the gate-on voltage VGH of the clock signal CLKn to the gate output OUTn, the back bias node BBn floated by turn-off of the second transistor T5*bb*2 becomes high logic along the Q node by coupling of the second capacitor CQ.

Subsequently, when the Q node descends from a bootstrapping voltage to high logic along the clock signal CLKn during the on-period Qon of the Q node and the gate output OUTn descends from the gate-on voltage VGH to the second gate-off voltage VSS, the back bias node BBn may primarily descend from high logic to low logic along the Q node.

For the off-period Qoff of the Q node, that is, while the Q node descends from high logic to low logic and the gate output OUTn is outputting the second gate-off voltage VGL through the pull-down transistor T7, the back bias node BBn may secondarily descend from low logic to a voltage lower than the second gate-off voltage VSS along the Q node.

Meanwhile, the Q node may directly descend from the bootstrapping voltage to low logic, and the back bias node BBn may directly descend from high logic to the voltage lower than the second gate voltage VSS along the Q node.

Therefore, the back bias circuit 60 may generate the back gate bias voltage lower than the second gate-off voltage VSS for the off-period Qoff of the Q node and apply the generated back gate bias voltage to the light shielding layers LS of the pull-up transistor T6 and the QB discharging transistor T5*q* to shift negative threshold voltages of the corresponding transistors T6 and T5*q* to positive threshold voltages, thereby reducing or minimizing a leakage current and reducing power consumption.

The first and second transistors T5*bb*1 and T5*bb*2 of the back bias circuit 60 may apply a corresponding gate signal to the light shielding layer LS (FIG. 3) by using the light shielding layer LS as a bottom gate electrode to reduce a leakage current of the back bias node BBn, and may float the top gate electrode GE (FIG. 3). That is, the light shielding layer of the first transistor T5bb1 may be connected with the drain electrode, and the light shielding layer of the second transistor T5bb2 may be connected with the set terminal 2.

In this case, the on-current Ion of the first and second transistors T5bb1 and T5bb2 may be reduced and the S-factor may be increased by the thickness of the buffer film BF thicker than the gate insulating film GI, whereby the leakage current may be reduced. The reduced on-current Ion characteristics of the first and second transistors T5bb 1 and T5bb2 do not affect the gate output OUTn.

Meanwhile, the light shielding layers LS of the transistors T1, T3, T4 and T7 which are not connected with the back bias node BBn in each stage STn may be floated or connected with the top gate electrode of the corresponding transistor.

Figure 6:
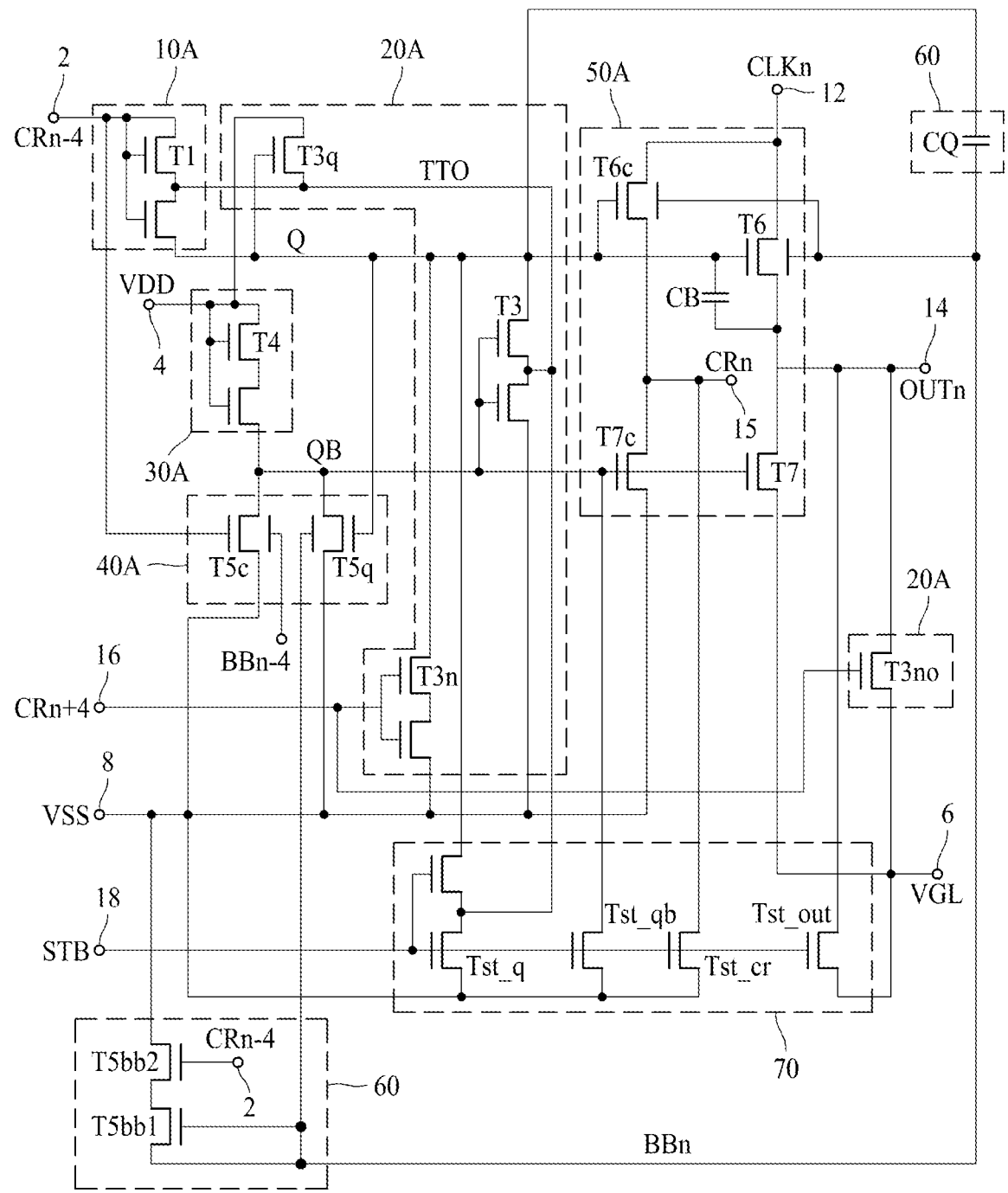
FIG. 6 is an equivalent circuit view illustrating a structure of each stage according to one embodiment of the present disclosure.

FIG. 6 is an equivalent circuit view illustrating a structure of each stage STn in a gate driver according to one embodiment of the present disclosure.

Referring to FIG. 6, each stage STn may include a first charging portion 10A, a first discharging portion 20A, a second charging portion 30A, a second discharging portion 40A, an output portion 50A, a back bias circuit 60, and a stabilization portion 70. The first charging portion 10A, the first discharging portion 20A, the second charging portion 30A, the second discharging portion 40A, and the stabilization portion 70 may be defined as controllers. Each of transistors T1, T3, T3n, T3no, T4, T5q, T5c, T6, T6c, T7, T7c, T5bb1 and T5bb2 constituting each stage STn, as shown in FIG. 3, may be a coplanar type oxide TFT that includes a light shielding layer LS.

Hereinafter, elements of FIG. 6 modified from those of FIG. 4 will be described with reference to driving waveforms shown in FIG. 5, and the other repeated elements will be omitted or simply mentioned.

The output portion 50A may further include a second pull-up transistor T6c and a second pull-down transistor T7c, which are connected with the carry terminal 15, in addition to the first pull-up transistor T6 and the first pull-down transistor T7, which are connected with the output terminal 14.

The second pull-up transistor T6c may be pulled-up for the on-period Qon of the Q node by the control of the Q node to output the clock signal CLKn applied to the clock terminal 12 as a carry signal CRn through the carry terminal 15. The second pull-down transistor T7c may be pulled-down for the off-period Qoff of the Q node by the control of the QB node to output the second gate-off voltage VSS from the third power terminal 8 as a carry signal CRn through the carry terminal 15.

The first charging portion 10A may include a pair of Q charging transistors T1 having gate electrodes commonly connected to the set terminal 2, serially connected between the set terminal 2 and the Q node. The pair of Q charging transistors T1 are turned on when the start signal VST or the carry signal CRn−4 of the preceding stage is high logic, thereby precharging the Q node. The carry signal CRn−4 of the preceding stage means a carry signal output through the carry terminal of the (n−4)th preceding stage.

The first discharging portion 20A may include a pair of first Q discharging transistors T3 having gate electrodes commonly connected to the QB node, serially connected between the Q node and the third power terminal 8. The pair of first Q discharging transistors T3 may be turned on when the QB node is high logic, thereby discharging the Q node with the second gate-off voltage VSS of the third power terminal 8.

The first discharging portion 20A may further include a pair of second Q discharging transistors T3n having gate electrodes commonly connected to a reset terminal 16 to which a carry signal CRn+4 of a subsequent stage or a reset signal is supplied, serially connected between the Q node and the third power terminal 8. The carry signal CRn+4 of the subsequent stage means a carry signal output through the carry terminal of the (n+4)th subsequent stage. The pair of second Q discharging transistors T3n may be turned on when the carry signal CRn+4 of the subsequent stage or the reset signal is high logic, thereby discharging the Q node with the second gate-off voltage VSS of the third power terminal 8.

The first discharging portion 20A may further include an output discharging transistor T3no in which a gate electrode is connected to the reset terminal 16, a drain electrode is connected to the output terminal 14 and a source electrode is connected to the second power terminal 6. The output discharging transistor T3no may be turned on when the carry signal CRn+4 of the subsequent stage or the reset signal is high logic, thereby quickly discharging the output terminal 14 with the second gate-off voltage VGL of the second power terminal 6.

The first discharging portion 20A may further include an offset transistor T3q generating an offset voltage in a transistor-transistor offset (TTO) node for the on-period Qon of the Q node in response to the control of the Q node. In the offset transistor T3q, a gate electrode is connected to the Q node, a drain electrode is connected to the first power terminal 4 and a source electrode is connected to the TTO node. The offset transistor T3q may be turned on for the on-period Qon when the Q node is high logic, thereby supplying the high potential voltage VDD from the first power terminal 4 to the TTO node as an offset voltage, and thus reducing or minimizing a leakage current of the transistors T1, T3 and T3n connected with the TTO node.

The TTO node may commonly be connected with an intermediate node between the pair of Q charging transistors T1, an intermediate node between the pair of first Q discharging transistors T3 and an intermediate node between the pair of second Q discharging transistors T3n.

Any one of the pair of first Q discharging transistors T3 turned off by low logic of the QB node for the on-period Qon of the Q node, to the source electrode of which the offset voltage of the high potential voltage VDD is applied through the TTO node, may reduce or minimize a leakage current as a gate-source voltage Vgs becomes a negative value lower than a threshold voltage.

Any one of the pair of second Q discharging transistors T3n turned off by low logic of the QB node for the on-period Qon of the Q node, to the source electrode of which the offset voltage of the high potential voltage VDD is applied through the TTO node, may reduce or minimize a leakage current as a gate-source voltage Vgs becomes a negative value lower than a threshold voltage.

Any one of the pair of Q charging transistors T1 turned off by low logic of the set terminal 2 for the on-period Qon of the Q node, to the source electrode of which the offset voltage of the high potential voltage VDD is applied through the TTO node, may reduce or minimize a leakage current as a gate-source voltage Vgs becomes a negative value lower than a threshold voltage.

The second charging portion 30A may include a pair of QB charging transistors T4 having gate electrodes commonly connected to the first power terminal 4 to which the high potential voltage VDD is applied, serially connected between the first power terminal 4 and the QB node to charge the QB node with the high potential voltage VDD.

The second discharging portion 40A includes a first QB discharging transistor T5q for discharging the QB node with the second gate-off voltage VSS of the third power terminal 8 for the on-period Qon of the Q node in response to the control of the Q node.

The second discharging portion 40A may further include a second QB discharging transistor T5c for discharging the QB node with the second gate-off voltage VSS of the third power terminal 8 in response to the control of the set terminal 2. In the second QB discharging transistor T5c, a gate electrode is connected to the set terminal 2, a source electrode is connected to the third power terminal 8, and a drain electrode is connected to the QB node. The second QB discharging transistor T5c may be turned on when the set terminal 2 is high logic, thereby discharging the QB node with the second gate-off voltage VSS.

The stabilization portion 70 may include first to fourth stabilization transistors Tst_q, Tst_qb, Tst_cr and Tst_out for discharging each of the Q node, the QB node, the carry terminal 15 and the output terminal 14 with the second gate-off voltage VSS of the third power terminal 8 in response to a stabilization signal STB applied to a stabilization terminal 18.

The first to fourth stabilization transistors Tst_q, Tst_qb, Tst_cr and Tst_out are simultaneously turned on by high logic of the stabilization signal STB applied to the stabilization terminal 18 for a vertical blank period of each frame based on a vertical synchronization signal, and are turned off by low logic of the stabilization signal STB for an active period of each frame. The first stabilization transistor Tst_q discharges the Q node with the second gate-off voltage VSS, the second stabilization transistor Tst_qb discharges the QB node with the second gate-off voltage VSS, the third stabilization transistor Tst_cr discharges the carry terminal 15 with the second gate-off voltage VSS, and the fourth stabilization transistor Tst_out discharges the output terminal 14 with the second gate-off voltage VSS, whereby main nodes of each stage STn are all initialized.

The first stabilization transistor Tst_q may include a pair of stabilization transistors Tst_q connected in series, and an intermediate node between the pair of first stabilization transistors Tst_q may be connected with the TTO node to which the offset voltage is applied. Any one of the pair of first stabilization transistors Tst_q turned off by low logic of the stabilization signal STB for the on-period Qon of the Q node, to the source electrode of which the offset voltage of the high potential voltage VDD is applied through the TTO node, may reduce or minimize a leakage current as a gate-source voltage Vgs becomes a negative value lower than a threshold voltage.

The back bias node BBn of the back bias circuit 60 may apply a back gate bias voltage lower than the corresponding source voltage to the light shielding layers LS of the transistors T6, T6c and T5q, which account for a large proportion of a leakage current, for the off-period Qoff of the Q node, thereby reducing or minimizing the leakage current of the corresponding transistors T6, T6c and T5q. The back bias node BBn is connected with the light shielding layers LS of the first and second pull-up transistors T6 and T6c and the first QB discharging transistor T5q.

Meanwhile, since the second QB discharging transistor T5c is driven in response to the carry output CRn−4 of the preceding stage, the light shielding layer LS of the second QB discharging transistor T5c may be connected with the back bias node BBn−4 of the (n−4)th preceding stage, and may be supplied with a back gate bias voltage from the back bias node BBn−4 of the (n−4)th preceding stage.

The first and second transistors T5bb1 and T5bb2 of the back bias circuit 60 may be driven as bottom gate type transistors using the light shieling layer LS (FIG. 3) as a gate electrode, thereby reducing a leakage current.

In each stage STn, the light shielding layer LS of each of the transistors T1, T3, T3q, T3n, T3no, T4, T7, T7c, Tst_q, Tst_qb, Tst_cr and Tst_out, which are not connected with the back bias nodes BBn and BBn−4, may be floated or connected with the top gate electrode of the corresponding transistor.

FIGS. 7 to 10 are views illustrating an operation process of the back gate bias circuit.

Figure 7:
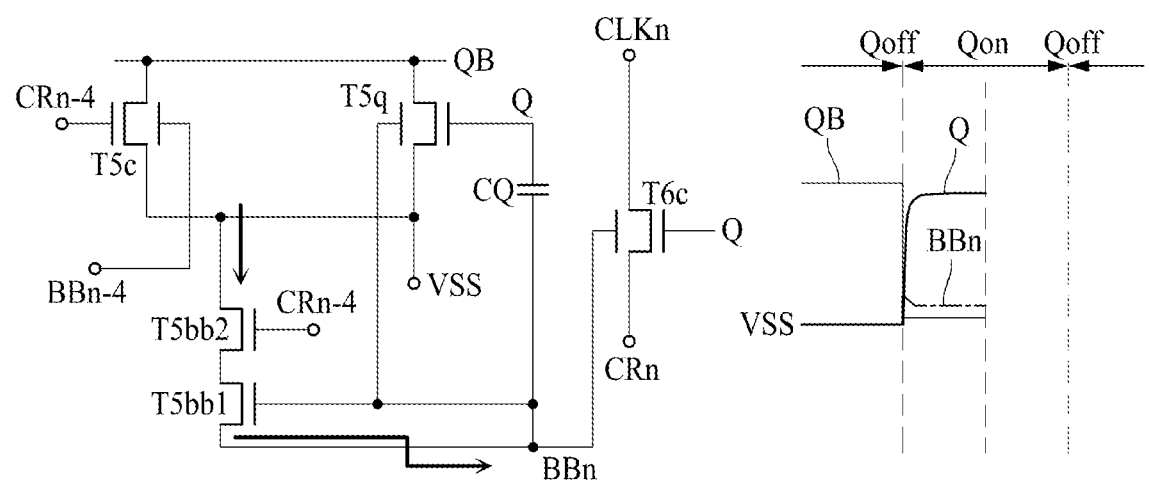
FIG. 7 is a view illustrating an operation process of a back gate bias circuit according to one embodiment of the present disclosure.

Referring to FIG. 7, while the Q node is being precharged with high logic during the on-period Qon of the Q node, the back bias node BBn is reset to the second gate-off voltage VSS through the second transistor T5bb2 and the first transistor T5bb1. At this time, it is noted that the second pull-up transistor T6c and the first QB discharging transistor T5q) are turned on by high logic of the Q node and the second QB discharging transistor T5c is also turned on by high logic of the carry output CRn−4 of the preceding stage.

Figure 8:
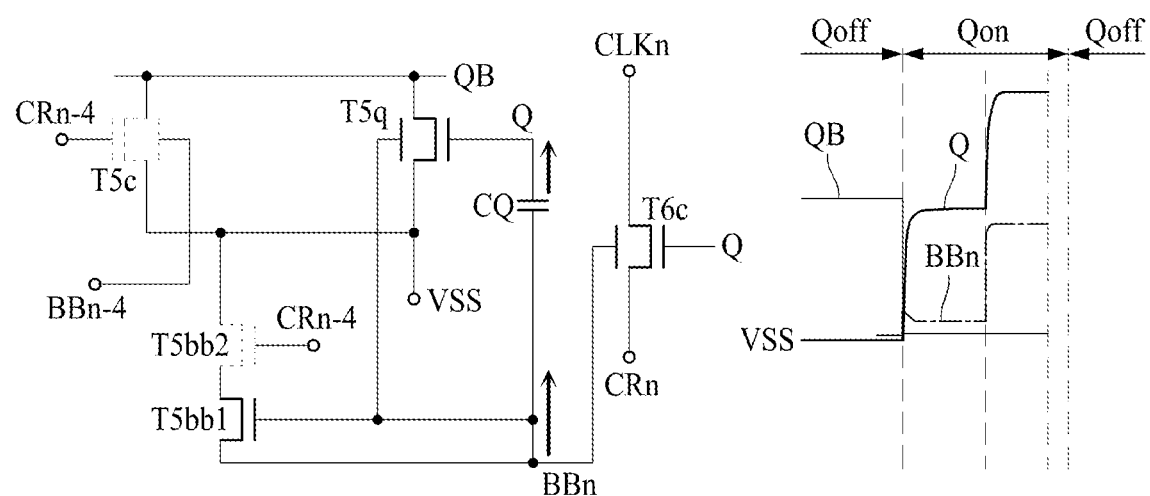
FIG. 8 is a view illustrating an operation process of a back gate bias circuit according to one embodiment of the present disclosure.

Referring to FIG. 8, while the Q node is being bootstrapped during the on-period Qon of the Q node, the back bias node BBn floated by turn-off of the second transistor T5bb2 becomes high logic along the Q node by coupling of the second capacitor CQ. At this time, it is noted that the second QB discharging transistor T5c is turned off by low logic of the carry output CRn−4 of the preceding stage.

Figure 9:
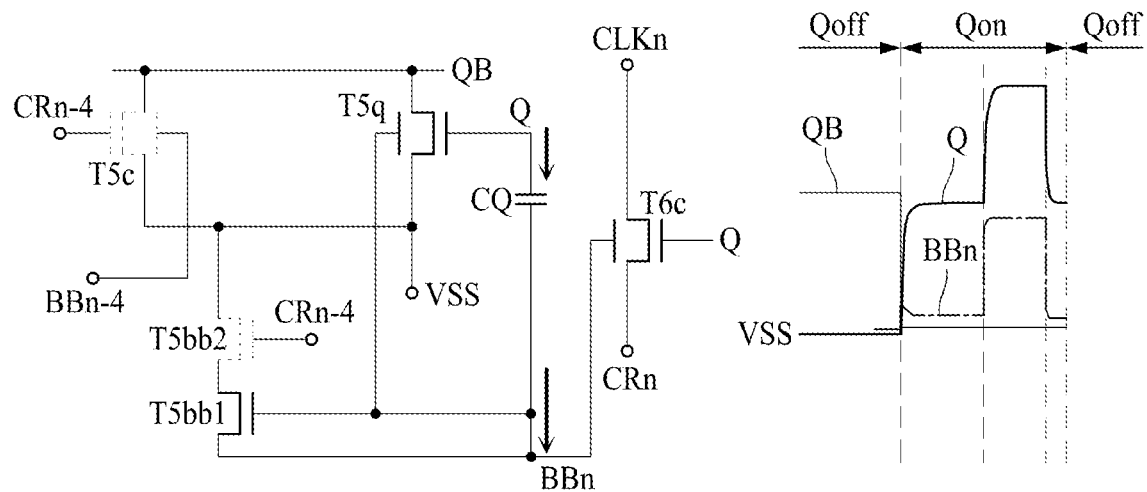
FIG. 9 is a view illustrating an operation process of a back gate bias circuit according to one embodiment of the present disclosure.

Referring to FIG. 9, as the Q node descends from a bootstrapping voltage to high logic along the clock signal CLKn during the on-period Qon of the Q node, the back bias node BBn may primarily descend from high logic to low logic along the Q node.

Figure 10:
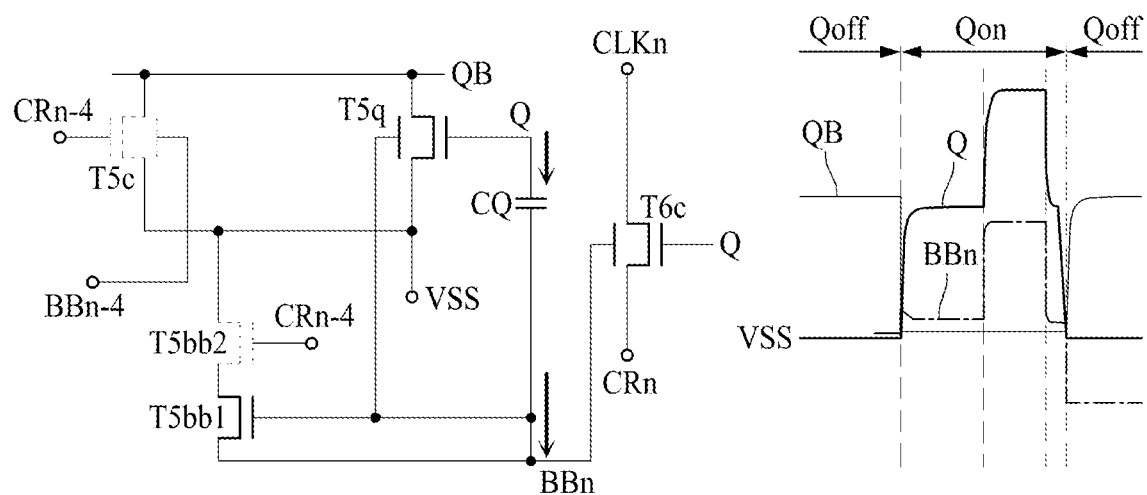
FIG. 10 is a view illustrating an operation process of a back gate bias circuit according to one embodiment of the present disclosure.

Referring to FIG. 10, for the off-period Qoff of the Q node which is maintained by descending from high logic to low logic, the back bias node BBn may be maintained by secondarily descending from low logic to a voltage lower than the second gate-off voltage VSS along the Q node.

Therefore, the back gate bias voltage lower than the corresponding source voltages VSS and VGL may be applied to the light shielding layers LS of the pull-up transistors T6 and T6c and the QB discharging transistors T5q and T5c through the back bias nodes BBn and BBn−4 for the off-period Qoff of the Q node, whereby negative threshold voltages of the corresponding TFTs may be shifted to positive threshold voltages. As a result, a leakage current may be reduced or minimized and power consumption may be reduced.

Figure 11:
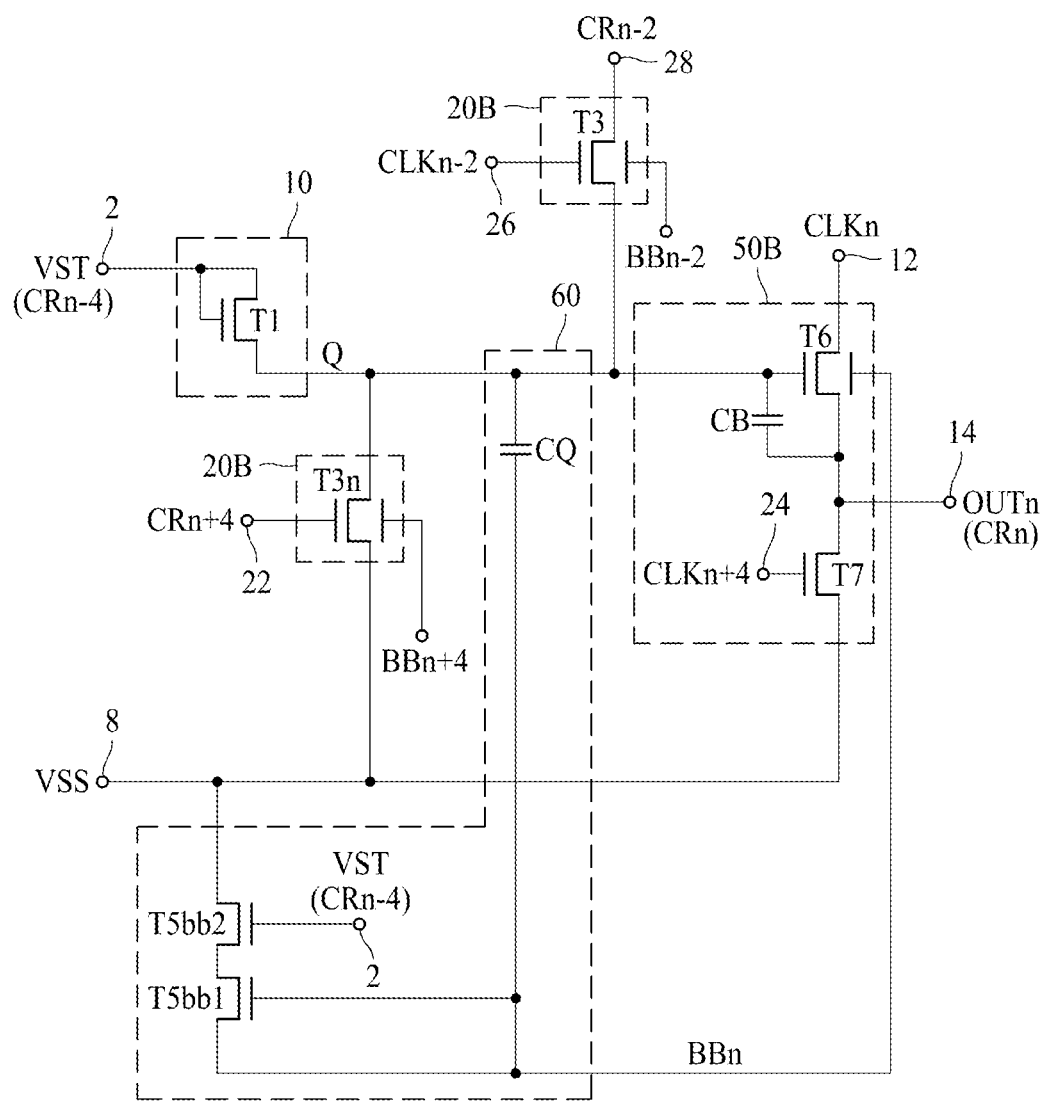
FIG. 11 is an equivalent circuit view illustrating a structure of each stage according to one embodiment of the present disclosure.

FIG. 11 is an equivalent circuit view illustrating a structure of each stage STn in a gate driver according to one embodiment of the present disclosure.

Referring to FIG. 11, each stage STn may include a charging portion 10, a discharging portion 20B, an output portion 50B, and a back bias circuit 60. The charging portion 10 and the discharging portion 20B may be defined as controllers. Each of transistors T1, T3, T3n, T6, T7, T5bb1 and T5bb2 constituting each stage STn, as shown in FIG. 3, may be a coplanar type oxide TFT that includes a light shielding layer LS.

Each stage STn may include a set terminal 2 to which any one of a start signal VST and an output CRn−4 of a (n−4)th preceding stage is applied as a set signal, a reset terminal 22 to which any one of an output CRn+4 of a (n+4)th subsequent stage and a reset signal is applied, a power terminal 8 to which a gate-off voltage VSS is applied, an output terminal 14 to which a gate output OUTn is applied, a first clock terminal 12 to which a first clock signal CLKn is applied, a third clock terminal 26 to which a third clock signal CLKn−2 is applied, a second clock terminal 24 to which a second clock signal CLKn+4 is applied, and a clear terminal 28 to which an output CRn−2 of a (n−2)th preceding stage is applied. The gate output OUTn of each stage STn may be output to another stage as a carry signal CRn. High logic periods of the first clock signal CLKn and the third clock signal CLKn−2 may partially overlap each other. The first clock signal CLKn and the second clock signal CLKn+4 may have their respective phases opposite to each other, whereby their high logic periods may not overlap each other.

Hereinafter, the elements of FIG. 11, which are modified from those of FIG. 4, will only be described, and description of the other repeated elements will be omitted or described simply.

A charging transistor T1 of the charging portion 10 may be turned on through the set terminal 2 when the start signal VST and the output CRn−4 of the (n−4)th preceding stage are high logics, thereby precharging the Q node with high logic.

A first discharging transistor T3 of the discharging portion 20B may discharge the Q node with the output CRn−2 of the (n−2)th stage of the clear terminal 28 in response to high logic of the third clock signal CLKn−2 applied to the third clock terminal 26. Meanwhile, the precharging period of the Q node may partially overlap a high logic period of the output CRn−2 of the (n−2)th stage.

A second discharging transistor T3n of the discharging portion 20B may be turned on when the output CRn+4 of the (n+4)th subsequent stage or the reset signal applied to the reset terminal 22 is high logic, thereby discharging the Q node with the gate-off voltage VSS.

A pull-up transistor T6 of the output portion 50B may be pulled-up for the on-period of the Q node under the control of the Q node, thereby outputting the first clock signal CLKn applied to the first clock terminal 12 to the gate output OUTn through the output terminal 14.

A pull-down transistor T7 of the output portion 50B may periodically be pulled-down for the off-period of the Q node under the control of the second clock signal CLKn+4 applied to the second clock terminal 24, thereby outputting the gate-off voltage VSS from the power terminal 8 to the gate output OUTn through the output terminal 14.

The back bias node BBn of the back bias circuit 60 may apply a back gate bias voltage lower than the corresponding source voltage to the light shielding layer LS of the pull-up transistor T6 for the off-period Qoff of the Q node, thereby reducing or minimizing a leakage current of the corresponding transistor 6.

Since the first discharging transistor T3 is driven in response to the second clock signal CLKn−2 used as the output CRn−2 of the (n−2)th preceding stage, the light shielding layer LS of the first discharging transistor T3 may be connected with the back bias node BBn−2 of the (n−2)th preceding stage, and may be supplied with a back gate bias voltage from the back bias node BBn−2 of the (n−2)th preceding stage.

Since the second discharging transistor T3n is driven in response to the output CRn+4 of the (n+4)th subsequent stage, the light shielding layer LS of the second discharging transistor T3n may be connected with the back bias node BBn+4 of the (n+4)th preceding stage, and may be supplied with a back gate bias voltage from the back bias node BBn+4 of the (n+4)th preceding stage.

The first and second transistors T5bb1 and T5bb2 of the back bias circuit 60 may be driven as bottom gate type transistors using the light shieling layer LS (FIG. 3) as a gate electrode, thereby reducing a leakage current.

In each stage STn, the light shielding layer LS of each of the transistors T1 and T7, which are not connected with the back bias nodes BBn, BBn−2 and BBn+4, may be floated or connected with the top gate electrode of the corresponding transistor.

Figure 12:
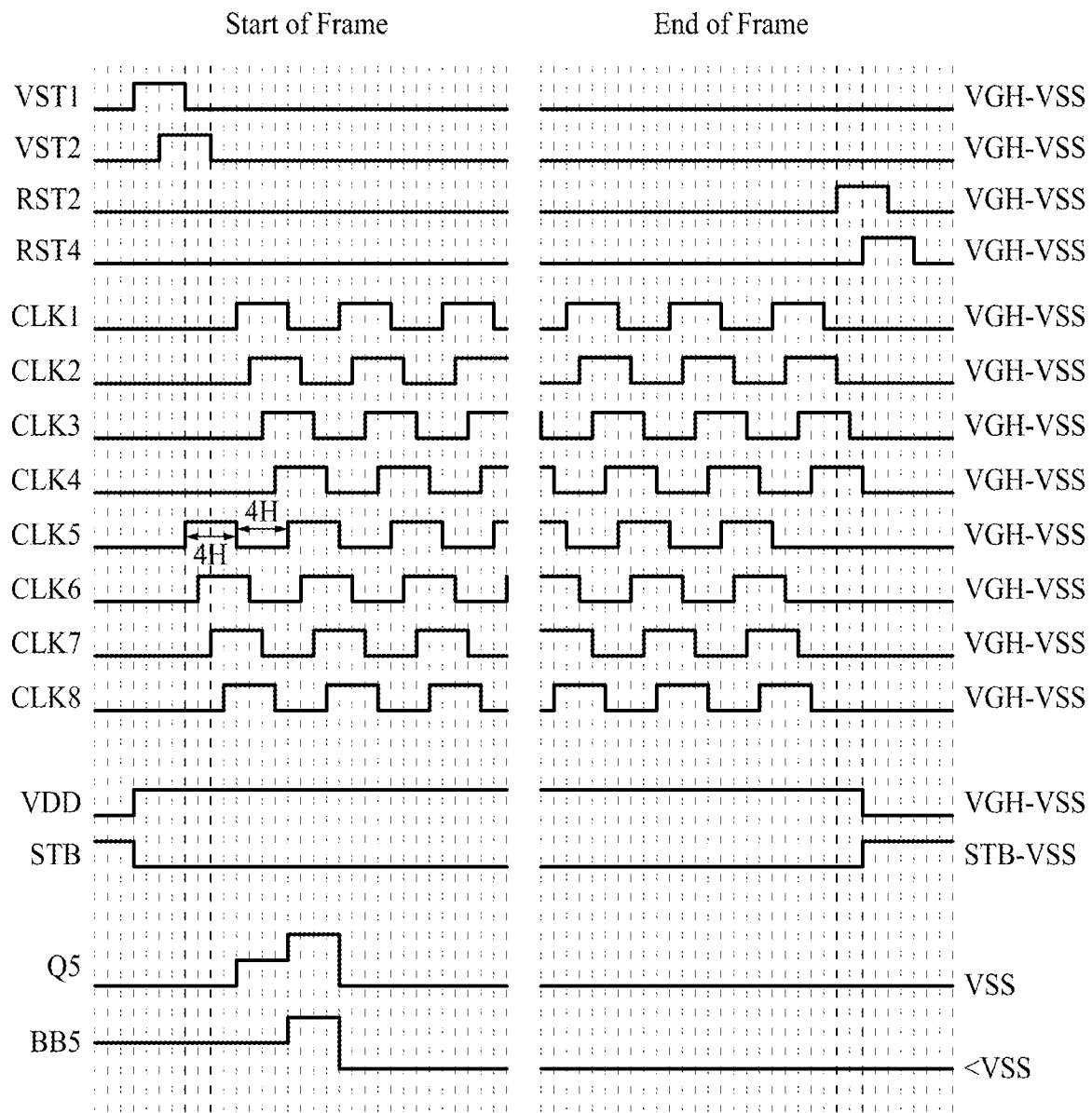
FIG. 12 is a driving waveform view of a gate driver according to one embodiment of the present disclosure.

FIG. 12 is a driving waveform view of a gate driver according to one embodiment of the present disclosure.

Referring to FIG. 12, the high potential voltage VDD supplies the gate-on voltage VGH for the active period of each frame, and supplies the gate-off voltage VSS for the vertical blank period of each frame. The stabilization signal STB supplies a stabilization voltage STB for the vertical blank period of each frame, and supplies the gate-off voltage VSS for the active period of each frame.

Each stage of the gate driver according to one embodiment, as shown in FIG. 12, may be supplied with at least any one of 8-phase clock signals CLK1 to CLK8 of which high logic periods are partially overlapped with one another while phases are being delayed in due order.

A high logic (gate-on voltage VGH) period of 4 H period and a low logic (gate-off voltage VSS) period of 4 H period are alternately repeated in each of the 8-phase clock signals CLK1 to CLK8. The high logic periods of the 8-phase clock signals CLK1 to CLK8 are sequentially phase-delayed by 1 H period, and the high logic period of each clock signal may overlap the high logic period of each of the other clocks adjacent thereto for 3 H period, 2 H period and 1 H period. The 8-phase clock signals CLK1 to CLK8 may sequentially be output to the corresponding gate output OUT such that each gate output OUT may have a high logic period of 4 H period, whereby a sufficient charging time may be provided during high speed driving. In the 8-phase clock signals CLK1 to CLK8, a clock having an nth phase and a clock having a (n+4)th phase, for example, the first clock CLK1 and the fifth clock CLK5 have phases inverted with respect to each other.

For example, a Q5 node of a fifth stage ST5 may be precharged when a first start signal VST1 is high logic, and may be bootstrapped when a fifth clock signal CLK5 is high logic, whereby the fifth clock signal CLK5 may be output to the gate output of the corresponding stage and then discharged with the gate-off voltage VSS.

It is noted that a back bias node BB5 of the fifth stage ST5 is reset to the gate-off voltage VSS during precharging of the Q5 node, ascends to high logic during bootstrapping of the Q node and then is lowered to the back gate bias voltage lower than the gate-off voltage VSS for an off-period of the Q5 node.

When the gate driver includes N stages respectively driving N gate lines, in FIG. 12, the first start signal VST1 may be supplied to set terminals of first and second stages of the gate driver, and a second start signal VST2 may be supplied to set terminals of third and fourth stages of the gate driver. A first rest signal RST2 may be supplied to (N−3)th and (N−2)th stages, and a second reset signal RST4 may be supplied reset terminals of (N−2)th and (N−1)th stages. A high logic period of the second start signal VST2 may partially overlap that of the first start signal VST1. A high logic period of the second reset signal RST4 may partially overlap that of the first reset signal RST2. Each of the start signals VST1 and VST2 and the reset signals RST2 and RST4 includes a high logic period of the gate-on voltage VGH and a low logic period of the gate-off voltage VSS.

Any one of the 8-phase clocks CLK1 to CLK8 may be supplied to the clock terminal 12 of each stage STn of the gate driver according to one embodiment, which is shown in FIGS. 4 and 6.

A first clock CLKn of any one of the 8-phase clocks CLK1 to CLK8 may be supplied to the first clock terminal 12 of each stage STn of the gate driver according to one embodiment, which is shown in FIG. 11, a third clock CLKn−2 of which high logic of 2 H period overlaps that of the first clock CLKn and phase is faster than that of the first clock CLKn may be supplied to the third clock terminal 26, and a second clock CLKn+4 phase-inverted with the first clock CLKn may be supplied to the second clock terminal 24.

Figure 13:
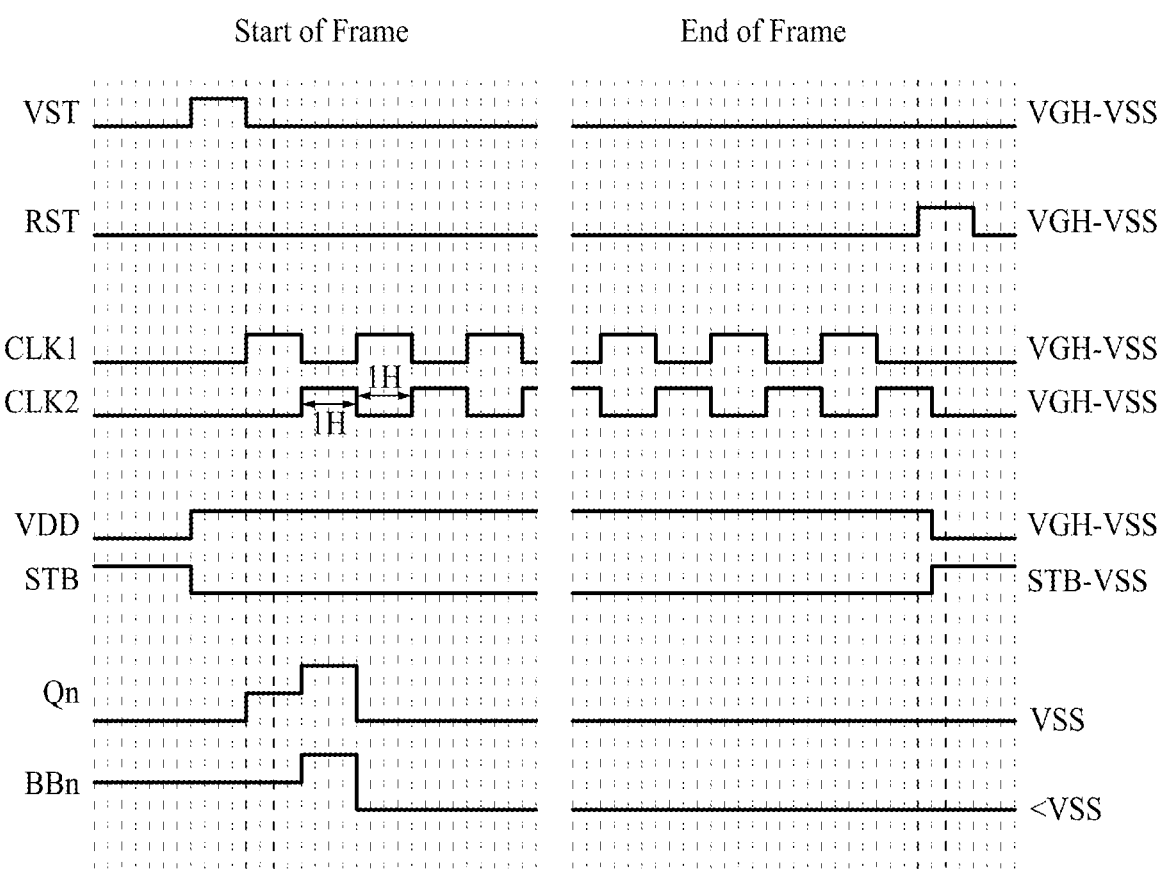
FIG. 13 is a driving waveform view of a gate driver according to one embodiment of the present disclosure.

FIG. 13 is a driving waveform view of a gate driver according to one embodiment of the present disclosure.

Elements of FIG. 13, which are different from those of FIG. 12, will only be described, and description of elements of FIG. 13, which are repeated with those of FIG. 12, will be omitted. Each stage of the gate driver according to one embodiment, which are shown in FIGS. 4 and 6, may be supplied with at least any one of first and second clock signals CLK1 and CLK2 of which high logic of 1 H period and low logic of 1 H period are phase-inverted with each other, through the clock terminal 12, as shown in FIG. 13.

For example, a Qn node of an nth stage ST5 may be precharged when an output of a preceding stage using the start signal VST or the first clock signal CLK1 is high logic, and may be bootstrapped when the second clock signal CLK2 is high logic, whereby the second clock signal CLK2 may be output to the gate output of the corresponding stage and then discharged with the gate-off voltage VSS.

It is noted that a back bias node BBn of the nth stage ST5 is reset to the gate-off voltage VSS during precharging of the Qn node, ascends to high logic during bootstrapping of the Q node and then is lowered to the back gate bias voltage lower than the gate-off voltage VSS for an off-period of the Qn node.

As described above, the gate driver and the display device according to one or more embodiments of the present disclosure may comprise the back gate bias circuit coupled with the Q node, thereby further applying the back gate bias lower than the source voltage to the light shielding layers of the TFTs which account for a large proportion of a leakage current for the off-period of the Q node (off-period of the gate output).

Therefore, since the gate driver and the display device according to one or more embodiments of the present disclosure may shift the negative threshold voltage to the positive threshold voltage by further applying the back gate bias to the corresponding TFT even though the coplanar type oxide TFT is used, the leakage current may be reduced or minimized and power consumption caused by the leakage current may be reduced.

The gate driver and the display device comprising the same according to one or more embodiments of the present disclosure may be applied to various electronic devices. For example, the gate driver and the display device comprising the same according to one embodiment of the present disclosure may be applied to a mobile device, a video phone, a smart watch, a watch phone, a wearable device, a foldable device, a rollable device, a bendable device, a flexible device, a curved device, an electronic diary, electronic book, a portable multimedia player (PMP), a personal digital assistant (PDA), MP3 player, a mobile medical device, a desktop PC, a laptop PC, a netbook computer, a workstation, a navigator, a vehicle navigator, a vehicle display device, a television, a wall paper display device, a signage device, a game device, a notebook computer, a monitor, a camera, a camcorder, and home appliances.

A display device according to one or more embodiments of the present disclosure will be described below.

A gate driver of a display device according to an embodiment of the present disclosure may comprise a plurality of stages, each stage including an output portion, a controller, and a back bias circuit. The output portion may include a pull-up transistor outputting a corresponding clock among a plurality of clocks as a gate signal in response to control of a first node (Q node), and a pull-down transistor outputting a gate-off voltage as an off-voltage of a gate signal in response to control of a second node (QB node). The controller may charge and discharge the Q node and charge and discharge the QB node to be an opposite state with respect to the Q node. The back bias circuit may have a back bias node capacitance-coupled with the Q node and generate a back gate bias voltage to apply the back gate bias voltage to the back bias node for an off-period of the Q node. The back bias circuit may apply the back gate bias voltage to light shielding layers of some transistors, which are turned off for the off-period of the Q node, among transistors constituting the output portion and the controller, through the back bias node.

The back bias circuit may reset the back bias node to a second gate-off voltage applied to the back bias circuit for a first period of an on-period of the Q node, in which the Q node is precharged, and a voltage of the back bias node may be varied depending on an operation of the Q node for the other periods except the first period of the on-period of the Q node, and the off-period of the Q node subsequent to the on-period of the Q node.

The back bias node may ascend to high logic along the Q node coupled thereto, for a second period of the on-period of the Q node, in which the Q node is bootstrapped, and may descend from the high logic to the back gate bias voltage along the Q node coupled thereto, when the Q node is maintained by descending from a bootstrapping voltage to low logic for the off-period of the Q node.

The Q node may primarily descend from the bootstrapping voltage to high logic and then secondarily descend to the low logic, and the back bias node may primarily descend from the high logic to the low logic along the Q node coupled thereto and then secondarily descend to the back gate bias voltage.

The back bias circuit may include a capacitor connected between the Q node and the back bias node; a first transistor connected to the back bias node in a diode structure; and a second transistor resetting the back bias node through the first transistor and floating the back bias node in response to a set signal corresponding to any one of a start signal and an output of a preceding stage, and the voltage of the floated back bias node may be varied depending on the operation of the Q node.

Each the first and second transistors of the back bias circuit may include a first gate electrode spaced from a semiconductor layer by a gate insulating film interposed therebetween, and light shielding layers of the first and second transistors of the back bias circuit are respectively used as a second gate electrode facing the first gate electrode and spaced from the semiconductor layer by a buffer layer interposed therebetween; the first gate electrode is supplied with a gate signal and the second gate electrode is floated.

The back bias node may be connected with a light shielding layer of the pull-up transistor and a light shielding layer of a QB discharging transistor discharging the QB node in response to the control of the Q node in the controller.

The output portion may further include a second pull-up transistor outputting an input clock to a carry terminal in response to the control of the Q node and a second pull-down transistor outputting a second gate-off voltage to the carry terminal in response to the control of the QB node, and the back bias node may also be connected to a light shielding layer of the second pull-up transistor.

The controller may include a discharging transistor discharging the QB node in response to an output of a preceding stage, and a light shielding layer of the discharging transistor may be connected to a back bias node belonging to the preceding stage and supplied with a back gate bias voltage of the corresponding preceding stage.

The controller may include a first charging portion including a Q charging transistor precharging the Q node with a set signal, which is any one of a start signal and an output of a preceding stage, in response to the set signal; a second charging portion including a QB charging transistor charging the QB node with a high potential voltage; a first discharging portion including a Q discharging transistor discharging the Q node with a second gate-off voltage by the control of the QB node; and a second discharging portion including a QB discharging transistor discharging the QB node with the second gate-off voltage by the control of the Q node, and the back bias node may apply the back gate bias voltage lower than the second gate-off voltage to light shielding layers of the pull-up transistor and the QB discharging transistor for the off-period of the Q node.

The first discharging portion may further include a second Q discharging transistor discharging the Q node with the second gate-off voltage in response to a reset signal and an output of a subsequent stage; and a discharging transistor discharging an output terminal with the gate-off voltage in response to the reset signal and the output of the subsequent stage, the second discharging portion may further include a second QB discharging transistor discharging the QB node with the second gate-off voltage in response to the set signal, and the output portion may further include a second pull-up transistor outputting the input clock to a carry terminal in response to the control of the Q node and a second pull-down transistor outputting the second gate-off voltage to the carry terminal in response to the control of the QB node. The back bias node may apply the back gate bias voltage lower than the second gate-off voltage to a light shielding layer of the second pull-up transistor for the off-period of the Q node, and a light shielding layer of the second QB discharging transistor may be connected with a back bias node belonging to the preceding stage outputting the set signal such that the back bias voltage of the preceding stage may be applied thereto.

The first discharging portion may further include an offset transistor generating an offset voltage of a high potential voltage and outputting the generated offset voltage to an offset node for the on-period of the Q node in response to the control of the Q node. Each of the Q charging transistor, the QB charging transistor, the first Q discharging transistor and the second Q discharging transistor may include a pair of serial transistors. The offset node may be connected with an intermediate node between the pair of Q charging transistors and an intermediate node between the pair of first Q discharging transistors.

Each stage of the gate driver may further comprise a stabilization portion including first to fourth stabilization transistors resetting the Q node, the QB node, the carry terminal and the output terminal to the gate-off voltage in response to a stabilization signal for a vertical blank period of each frame. The first stabilization transistor may include a pair of first stabilization transistors serially connected to each other, and the offset node may be connected with an intermediate node between the pair of first stabilization transistors.

Each of the other transistors except the transistors connected with the back bias circuit among the transistors constituting the output portion and the controller may include a corresponding light shielding layer facing a corresponding gate electrode by interposing a corresponding semiconductor layer, and the corresponding light shielding layer may be floated or connected with the corresponding gate electrode.

A gate driver of a display device according to an embodiment of the present disclosure may comprise a plurality of stages, each stage including an output portion, a charging portion, a discharging portion and a back bias circuit. The output portion may include a pull-up transistor pulled-up by control of a Q node, outputting a first input clock of a plurality of clocks to an output terminal, and a pull-down transistor pulled-down by control of a second input clock, outputting a gate-off voltage to the output terminal. The charging portion may include a charging transistor precharging the Q node with a set signal, which is any one of a start signal and an output of a preceding stage, in response to the set signal. The discharging portion may include a first discharging transistor discharging the Q node in response to control of a third input clock, and a second discharging transistor discharging the Q node in response to a reset signal or an output of a subsequent stage. The back bias circuit may have a back bias node capacitance-coupled with the Q node and generate a back gate bias voltage in the back bias node for an off-period of the Q node by the discharging portion. The back bias circuit may apply a back gate bias voltage, which is lower than the gate-off voltage, to a light shielding layer of the pull-up transistor, which is turned off for the off-period of the Q node, through the back bias node.

The first discharging transistor may discharge the Q node with an output of a second preceding stage outputting the third input clock to a corresponding output terminal, and a back bias node belonging to the second preceding stage may be connected to a light shielding layer of the first discharging transistor.

A back bias node belonging to the subsequent stage may be connected to a light shielding layer of the second discharging transistor.

The back bias circuit may include a capacitor connected between the Q node and the back bias node, a first transistor connected to the back bias node in a diode structure, a second transistor resetting the back bias node through the first transistor and floating the back bias node in response to the set signal, and a voltage of the floated back bias node may be varied depending on an operation of the Q node.

Each of the first and second transistors of the back bias circuit may include a first gate electrode spaced from a semiconductor layer by a gate insulating film interposed therebetween, and light shielding layers of the first and second transistors of the back bias circuit may be respectively used as a second gate electrode facing the first gate electrode and spaced from the semiconductor layer by a buffer layer interposed therebetween, and the first gate electrode may be supplied with a gate signal and the second gate electrode may be floated.

Each of the other transistors except the transistors connected with the back bias circuit may include a corresponding light shielding facing a corresponding gate electrode by interposing a corresponding semiconductor layer, and the corresponding light shielding layer may is floated or connected with the corresponding gate electrode.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is intended to cover all variations or modifications derived from the meaning, scope, and equivalent concept of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising
a display panel; and
a gate driver embedded in a display panel, the gate driver including a selected plurality of stages respectively driving a plurality of gate lines, each stage of the selected plurality including:
an output portion including a pull-up transistor pulled-up by control of a first node, outputting an input clock of a plurality of clocks to an output terminal, and a pull-down transistor pulled-down by control of a second node, outputting a gate-off voltage to the output terminal;
a controller charging and discharging the first node and charging and discharging the second node to be in an opposite state of the first node; and
a back bias circuit having a back bias node capacitance-coupled with the first node and generating a back gate bias voltage to apply the back gate bias voltage to the back bias node for an off-period of the first node by the controller, and
wherein the back bias circuit applies the back gate bias voltage to light shielding layers of some transistors, which are turned off for the off-period of the first node, among transistors constituting the output portion and the controller, through the back bias node.

2. The display device of claim 1, wherein the back bias circuit applies the back gate bias voltage, which is lower than a gate voltage and a source voltage of a corresponding transistor, to a light shielding layer of the corresponding transistor through the back bias node for the off-period of the first node.

3. The display device of claim 1, wherein the back bias circuit resets the back bias node to a second gate-off voltage applied to the back bias circuit for a first period of an on-period of the first node, in which the first node is precharged, and
wherein a voltage of the back bias node is varied depending on an operation of the first node for the other periods except the first period of the on-period of the first node, and the off-period of the first node subsequent to the on-period of the first node.

4. The display device of claim 3, wherein the back bias node ascends to high logic along the first node coupled thereto, for a second period of the on-period of the first node, in which the first node is bootstrapped, and descends from the high logic to the back gate bias voltage along the first node coupled thereto, when the first node is maintained by descending from a bootstrapping voltage to low logic for the off-period of the first node.

5. The display device of claim 4, wherein the first node primarily descends from the bootstrapping voltage to corresponding high logic and then secondarily descends to the low logic, and the back bias node primarily descends from the high logic to corresponding low logic along the first node coupled thereto, and then secondarily descends to the back gate bias voltage.

6. The display device of claim 1, wherein the back bias circuit includes:
a capacitor coupled between the first node and the back bias node;
a first transistor coupled to the back bias node in a diode structure; and
a second transistor resetting the back bias node through the first transistor and floating the back bias node in response to a set signal corresponding to any one of a start signal and an output of a preceding stage, and
wherein the voltage of the floated back bias node is varied depending on the operation of the first node.

7. The display device of claim 6, wherein each of the first and second transistors of the back bias circuit includes a first gate electrode spaced from a semiconductor layer by a gate insulating film interposed therebetween, and light shielding layers of the first and second transistors of the back bias circuit are respectively used as a second gate electrode facing the first gate electrode and spaced from the semiconductor layer by a buffer layer interposed therebetween, and wherein the first gate electrode is supplied with a gate signal and the second gate electrode is floated.

8. The display device of claim 1, wherein the back bias node is coupled with a light shielding layer of the pull-up transistor and a light shielding layer of a QB discharging transistor discharging the second node in response to the control of the first node in the controller.

9. The display device of claim 8, wherein the output portion further includes a second pull-up transistor outputting the input clock to a carry terminal in response to the control of the first node and a second pull-down transistor outputting a second gate-off voltage lower than the gate-off voltage to the carry terminal in response to the control of the second node, and the back bias node is also coupled to a light shielding layer of the second pull-up transistor.

10. The display device of claim 1, wherein the controller includes a discharging transistor discharging the second node in response to an output of a preceding stage, and a light shielding layer of the discharging transistor is coupled to a back bias node belonging to the preceding stage and supplied with a back gate bias voltage of the corresponding preceding stage.

11. The display device of claim 1, wherein the controller includes:

a first charging portion including a Q charging transistor precharging the first node with a set signal, which is any one of a start signal and an output of a preceding stage, in response to the set signal;

a second charging portion including a QB charging transistor charging the second node with a high potential voltage;

a first discharging portion including a Q discharging transistor discharging the first node with a second gate-off voltage lower than the gate-off voltage by the control of the second node; and a second discharging portion including a QB discharging transistor discharging the second node with the second gate-off voltage by the control of the first node, and the back bias node applies the back gate bias voltage lower than the second gate-off voltage to light shielding layers of the pull-up transistor and the QB discharging transistor for the off-period of the first node.

12. The display device of claim 11, wherein the first discharging portion further includes:

a second Q discharging transistor discharging the first node with the second gate-off voltage in response to a reset signal and an output of a subsequent stage; and a discharging transistor discharging the output terminal with the gate-off voltage in response to the reset signal and the output of the subsequent stage, the second discharging portion further includes a second QB discharging transistor discharging the second node with the second gate-off voltage in response to the set signal, the output portion further includes a second pull-up transistor outputting the input clock to a carry terminal in response to the control of the first node and a second pull-down transistor outputting the second gate-off voltage to the carry terminal in response to the control of the second node, the back bias node applies the back gate bias voltage lower than the second gate-off voltage to a light shielding layer of the second pull-up transistor for the off-period of the first node, and a light shielding layer of the second QB discharging transistor is coupled with a back bias node belonging to the preceding stage outputting the set signal such that the back bias voltage of the preceding stage is applied thereto.

13. The display device of claim 12, wherein the first discharging portion further includes an offset transistor generating an offset voltage of a high potential voltage and outputting the generated offset voltage to an offset node for the on-period of the first node in response to the control of the first node, each of the Q charging transistor, the QB charging transistor, the first Q discharging transistor and the second Q discharging transistor includes a pair of serial transistors, and the offset node is coupled with an intermediate node between the pair of Q charging transistors and an intermediate node between the pair of first Q discharging transistors.

14. The display device of claim 13, wherein, for a vertical blank period of each frame, each stage further comprises a stabilization portion including:

a first stabilization transistor resetting the first node to the second gate-off voltage in response to a stabilization signal;

a second stabilization transistor resetting the second node to the second gate-off voltage in response to the stabilization signal;

a third stabilization transistor resetting the carry terminal to the second gate-off voltage in response to the stabilization signal; and a fourth stabilization transistor resetting the output terminal to the second gate-off voltage in response to the stabilization signal, and the first stabilization transistor includes a pair of first stabilization transistors serially coupled to each other, and the offset node is coupled with an intermediate node between the pair of first stabilization transistors.

15. The display device of claim 1, wherein each of the other transistors except the transistors coupled with the back bias circuit among the transistors constituting the output portion and the controller includes a corresponding light shielding layer facing a corresponding gate electrode by interposing a corresponding semiconductor layer, and the corresponding light shielding layer is floated or coupled with the corresponding gate electrode.

16. A display device comprising a display panel;

a gate driver in a display panel, the gate driver including a plurality of stages respectively driving a plurality of gate lines, each stage including:

an output portion including a pull-up transistor pulled-up by control of a first node, outputting a first input clock of a plurality of clocks to an output terminal, and a pull-down transistor pulled-down by control of a second input clock, outputting a gate-off voltage to the output terminal;

a charging portion including a charging transistor precharging the first node with a set signal, which is any one of a start signal and an output of a preceding stage, in response to the set signal;

a discharging portion including a first discharging transistor discharging the first node in response to control of a third input clock, and a second discharging transistor discharging the first node in response to a reset signal or an output of a subsequent stage; and a back bias circuit having a back bias node capacitance-coupled with the first node and generating a back gate bias voltage to apply the back gate bias voltage to the back bias node for an off-period of the first node by the discharging portion, and wherein the back bias circuit applies a back gate bias voltage, which is lower than the gate-off voltage, to a light shielding layer of the pull-up transistor, which is turned off for the off-period of the first node, through the back bias node.

17. The display device of claim 16, wherein the first discharging transistor discharges the first node with an output of a second preceding stage outputting the third input clock to a corresponding output terminal, and a back bias node belonging to the second preceding stage is coupled to a light shielding layer of the first discharging transistor.

18. The display device of claim 17, wherein a back bias node belonging to the subsequent stage is coupled to a light shielding layer of the second discharging transistor.

19. The display device of claim 16, wherein the back bias circuit includes:

a capacitor coupled between the first node and the back bias node;

a first transistor coupled to the back bias node in a diode structure; and a second transistor resetting the back bias node through the first transistor and floating the back bias node in response to the set signal, and wherein a voltage of the floated back bias node is varied depending on an operation of the first node.

20. The display device of claim 16, wherein each of the first and second transistors of the back bias circuit includes a first gate electrode spaced from a semiconductor layer by a gate insulating film interposed therebetween, and light shielding layers of the first and second transistors of the back bias circuit are respectively used as a second gate electrode facing the first gate electrode and spaced from the semiconductor layer by a buffer layer interposed therebetween, and wherein the first gate electrode is supplied with a gate signal and the second gate electrode is floated, and each of the other transistors except the transistors coupled with the back bias circuit includes a corresponding light shielding facing a corresponding gate electrode by interposing a corresponding semiconductor layer, and the corresponding light shielding layer is floated or coupled with the corresponding gate electrode.

* * * * *